United States Patent
Hao

(10) Patent No.: US 9,438,449 B2
(45) Date of Patent: Sep. 6, 2016

(54) DATA SAMPLING METHOD AND SYSTEM, AND APPLICATION METHOD AND SYSTEM THEREOF IN PARAMETER IDENTIFICATION

(71) Applicant: Yushan Hao, Baoding (CN)

(72) Inventor: Yushan Hao, Baoding (CN)

( * ) Notice: Subject to any disclaimer, the term of this patent is extended or adjusted under 35 U.S.C. 154(b) by 0 days.

(21) Appl. No.: 14/437,972

(22) PCT Filed: Oct. 23, 2013

(86) PCT No.: PCT/CN2013/085813
§ 371 (c)(1),
(2) Date: Apr. 23, 2015

(87) PCT Pub. No.: WO2014/063635
PCT Pub. Date: May 1, 2014

(65) Prior Publication Data
US 2015/0280943 A1    Oct. 1, 2015

(30) Foreign Application Priority Data
Oct. 23, 2012  (CN) .......................... 2012 1 0408534

(51) Int. Cl.
*H03H 7/40* (2006.01)
*G05F 1/613* (2006.01)
(Continued)

(52) U.S. Cl.
CPC ........... *H04L 25/0262* (2013.01); *G06F 7/535* (2013.01); *H03M 1/0626* (2013.01); *H04L 25/068* (2013.01)

(58) Field of Classification Search
CPC .............. G05B 19/41875; G05B 9/02; G05B 23/0213; G05B 13/047; G05B 19/042

USPC .......................................... 375/233; 323/223
See application file for complete search history.

(56) References Cited

U.S. PATENT DOCUMENTS 5,015,934 A * 5/1991 Holley .................... G05B 19/33
250/203.6
5,297,166 A * 3/1994 Batruni ............... H04L 25/0307
375/233

(Continued)

FOREIGN PATENT DOCUMENTS

CN         101614554 A    12/2009
CN         102331535 A    1/2012
(Continued)

OTHER PUBLICATIONS

International Search Report for related PCT Application No. PCT/CN2013/085813 mailed Jan. 30, 2014.

*Primary Examiner* — Daniel Washburn
*Assistant Examiner* — Sarah Hassan
(74) *Attorney, Agent, or Firm* — Troutman Sanders LLP

(57) ABSTRACT

The present invention relates to a data sampling method: sampling a physical quantity according to a sampling frequency $f_s \leq f_{sh}$, $f_{sh} = \zeta_{max}/\epsilon$ being the upper limit of the sampling frequency; and a data sampling method and system: sampling a physical quantity with a sampling frequency satisfying Nyquist theorem, firstly performing low-pass filtering on an obtained sampled sequence, and then re-sampling, the re-sampling frequency $f_s \leq \zeta_{max}/\epsilon$, where $\epsilon$ is the Z-domain error of a sampling system, and $\zeta_{max}$ the maximum error of an S-domain. The present invention also relates to a parameter identification method and system which firstly adopt the above data sampling method and system to obtain sampled data, and then utilize the sampled data to perform dynamic and/or static parameter identification. The data sampling method and system and the parameter identification method and system of the present invention solve technical difficulties such as relatively large errors in sampled data, digital control instability, and parameter identification failure.

13 Claims, 5 Drawing Sheets

(51) Int. Cl.
*H04L 25/02* (2006.01)
*G06F 7/535* (2006.01)
*H03M 1/06* (2006.01)
*H04L 25/06* (2006.01)

(56) References Cited

U.S. PATENT DOCUMENTS

| | | | | | |
|---|---|---|---|---|---|
| 6,005,377 | A | * | 12/1999 | Chen | H02M 3/157 323/223 |
| 2002/0114098 | A1 | * | 8/2002 | Magee | G11B 5/5521 360/77.02 |
| 2003/0050950 | A1 | * | 3/2003 | Agami | G06F 7/535 708/650 |
| 2004/0125742 | A1 | * | 7/2004 | Schmidt | H04L 27/2647 370/208 |
| 2004/0138106 | A1 | * | 7/2004 | Schultz | C12P 21/005 514/20.9 |
| 2005/0207583 | A1 | * | 9/2005 | Christoph | H03G 3/32 381/57 |
| 2006/0267695 | A1 | * | 11/2006 | Keating | H03L 7/091 331/16 |
| 2007/0279042 | A1 | * | 12/2007 | Tan | G01R 15/181 324/142 |
| 2008/0120356 | A1 | * | 5/2008 | Watanabe | H03H 17/04 708/320 |
| 2009/0003497 | A1 | * | 1/2009 | Kino | G10H 7/002 375/346 |
| 2011/0084676 | A1 | * | 4/2011 | Lin | H02M 3/156 323/283 |

FOREIGN PATENT DOCUMENTS

| | | |
|---|---|---|
| CN | 102377436 A | 3/2012 |
| CN | 102393214 A | 3/2012 |
| CN | 102946253 A | 2/2013 |

\* cited by examiner

S1: Sampling an electric signal y of a physical quantity with a sampled frequency satisfying the Nyquist theorem to obtain a sampled sequence Y1;

S2: Performing digital low-pass filtering on the sampled sequence Y1 to obtain a filtered sampled sequence Y2;

S3: Re-sampling the filtered sampled sequence Y2 to obtain a sampled sequence Y; the re-sampling frequency being $f_{rs}$, and $f_{rs} \leq \zeta_{max}/\varepsilon$, where $\varepsilon$ is a Z-domain error of a sampling system, and $\zeta_{max}$ is the maximum error of an S-domain;

S4: Outputting the sampled sequence Y.

FIG. 4

DATA SAMPLING METHOD AND SYSTEM, AND APPLICATION METHOD AND SYSTEM THEREOF IN PARAMETER IDENTIFICATION

CROSS-REFERENCE TO RELATED APPLICATIONS

This application is a US National Stage of International Application No. PCT/CN2013/085813 filed 23 Oct. 2013, which claims the benefit of CN 201210408534.9 filed 23 Oct. 2012, each herein fully incorporated by reference.

FIELD OF THE INVENTION

The present invention relates to a computer application technology, and in particular to sampling, parameter identification and data controlling technologies.

BACKGROUND OF THE INVENTION

The course of converting an analog quantity to a digital quantity is referred to as data sampling. The lower limit of the sampling frequency $f_{sl}=2 \cdot f_c$, which is the Nyquist sampling theorem, is provided by Nyquist in 1924. However, a system, which is stable under an analog controller becomes a digital control system after sampling. Said system the system would no longer be stable even if it complies with the sampling theorem. Parameter identification utilizing the data sampling rarely succeeded.

For the unsuccessful cases, it is normally deemed that the faster sampling frequency, the better the performance is, according to the sampling theorem. So, a technical person usually would choose to increase the sampling frequency. However, it is proved by the practical situation that even if the fastest sampling frequency is used, the problem cannot be solved. Therefore, attempts for constantly modifying, debugging, re-modifying and re-debugging the digital controlling and parameter identification apparatus are needed.

SUMMARY OF THE INVENTION

An objective of the present invention is to solve a problem said above. A digital controller converted from a stable analog controller being digitally sampled will still be stable and have equivalent performance. Further, accurate parameters can be identified based on the sampling data.

The inventor discovers, through painstaking research up to 30 years, from constantly trials and summarizing and analyzing the theoretical derivations, that the above said problem is not caused by the identification algorithm and digital control method, but caused by data sampling, and the problem of the data sampling is not caused by too slow sampling but caused by too fast sampling. The sampling frequency shall not be the situation as a person skilled in the art normally considers that the faster it is, the better it is. On the contrary, there is an upper limit $f_{sh}$ for the sampling frequency, and the sampling frequency exceeding the upper limit is the source of a relatively big sample-data-error, unstable digital controlling and the unsuccessful parameter identification.

The present invention proposes a data sampling method, comprising the following steps:

S1: performing analog low-pass filtering on an electric signal y of a physical quantity to obtain a filtered electric signal;

S2: sampling the filtered electric signal according to sampling frequency $f_s$, said sampling frequency satisfying the Nyquist theorem, that is to say, $f_s > f_{sl}$;

S3: outputting the sampled sequence Y;

wherein the sampling frequency $f_s$ in said step S2 also satisfies $f_s \leq f_{sh} = \zeta_{max}/\epsilon$, with $\epsilon$ being an Z-domain error of a sampling system, and $\zeta_{max}$ being the maximum error in S-domain;

Wherein, the Z-domain error of said sampling system satisfies $\epsilon \geq \delta$, with said $\delta$ being the cut-off error of the sampling system; and the cut-off error $\delta$ of said sampling system is associates with $\delta_{adc}$ and $\delta_{cpu}$, where $\delta_{adc}$ is half of the resolution ratio of an analog-to-digital converter and $\delta_{cpu}$ is the cut-off error of the expressing digits for the value in the computer.

Further, the Z-domain error of said sampling system satisfies $\epsilon = k_\alpha \cdot \delta$, where said $k_\alpha$ is an safety factor lager than 1 and the value thereof is determined by random disturbance level in the course of sampling, the computation error of the value in the sampling system or the combination thereof.

Wherein said maximum error $\zeta_{max}$ of S-domain is the maximum acceptable error for the S-domain determined by the specific application, such as $\zeta_{max}$ determined by the acceptable error of the S-domain zero-poles of the application system, or $\zeta_{max}$ correspondingly by the acceptable maximum error $\sigma_{max}$ of the time-domain differential equation of the application system.

In practical application, in order to reduce the volume and lower the cost, normally the sampling frequency is relatively high and does not satisfy the requirement of the sampling frequency upper limit $f_{sh}$. Thus, the present invention also proposes a second data sampling method, comprising the following steps:

S1: sampling the electric signal y of the physical quantity with a sampling frequency satisfying the Nyquist theorem to obtain a sampled sequence Y1;

S2: performing digital low-pass filtering on the sampled sequence Y1 to obtain a filtered sampled sequence Y2;

S3. re-sampling the filtered sampled sequence Y2 to obtain a sampled sequence Y; said re-sampling frequency being $f_{rs}$ and said $f_{rs} \leq f_{sh} = \zeta_{max}/\epsilon$; where $\epsilon$ is the Z-domain error of the sampling system and $\zeta_{max}$ is the maximum error of the S-domain;

S4: outputting the sampled sequence Y.

Further, the cut-off frequency of said low-pass filter is $f_c$ and said $f_c \leq 0.5 \times f_{rs}$, to avoid the occurrence of mixing in the course of re-sampling.

After the re-sampling, since it can be satisfied that the re-sampling frequency $f_{rs}$ is smaller than the sampling frequency upper limit $f_{sh}$, thus the S-domain error can be decreased within a preset range $\zeta_{max}$.

The contradiction that $f_{sh} < f_{sl}$ may occur in the practical situations, so that the sampling frequency can not be selected according to $f_{sl} < f_s \leq f_{sh}$ provided in the first method. The contradiction may be solved by the above said second data sampling method, that is, this contradiction can be solved by applying the method for low-pass filtering and re-sampling. The primary ploe $P_{rm}$ and the primary zero $P_{om}$ play a leading role among all of the ploes $\{p_{ri}\}$ and the zeros $\{p_{oi}\}$, and the higher the frequency of the pole or the zero is, the smaller it functions. Thus, if the contradiction of $f_{sh} < f_{sl}$ occurs, by filtering out the high frequency poles and zeros through said low-pass filter and further re-sampling to decrease the sampling frequency, not only said contradiction can be solved, but also the accuracies of the primary pole $P_{rm}$ and the primary zero $P_{om}$ can be ensured, wherein the primary pole or the primary zero is the pole or the zero approximate to the origin in S domain.

The present invention further proposes a data sampling system, comprising:

a sampling unit, used for sampling the electric signal y of a physical quantity with a sampling frequency satisfying the Nyquist theorem to obtain a sampled sequence Y1;

a low-pass filter, used for implementing digital low-pass filtering to the sampled sequence Y1 to obtain a filtered sampled sequence Y2;

a re-sampling unit, used for re-sampling the filtered sampled sequence Y2 to obtain a sampled sequence Y; said re-sampling frequency being $f_{rs}$ and said $f_{rs} \leq f_{sh} = \zeta_{max}/\epsilon$; wherein $\epsilon$ is the Z-domain error of a sampling system and $\zeta_{max}$ is the maximum error of S-domain;

Further, the cut-off frequency of said low-pass filter is $f_c$ and said $f_c \leq 0.5 \times f_{rs}$, avoiding the occurrence of mixing in the course of re-sampling.

By using re-sampling to decrease the sampling frequency in the present invention, the re-sampling frequency satisfies $f_{rs} \leq f_{sh} = \zeta_{max}/\epsilon$, so that a bigger error in the time domain and S-domain caused by the cut-off error of a digital sampling and a digital system can be reduced, thereby making the error in the S-domain and time domain satisfy the application requirement.

Digital sampling is either used for measuring, or used for identifying parameter or digital control. The parameters include static state parameter or dynamic state parameter. The static state parameter is the system function parameter, and the dynamic state parameter is the system differential function parameter. For the electrical system, the static state parameter refers to the admittance matrix of the power flow equations, that is, the resistor, reactance and susceptance of an element such as a transformer, a wire, or a generator, etc. The dynamic state parameter refers to exciting time constant, speed regulation time constant, or rotor time constant, etc. For the purpose of a better understanding for the practicability of said sampling method, the present invention provides an application of said sampling method and system in a parameter identification field.

A parameter identification method applying said two data sampling methods is characterized in that the method further comprises step S5, which comprises step S51 for performing a dynamic state parameter identification according to the sampled sequence Y, and/or step S52 for performing a static state parameter identification according to the sampled sequence Y.

Wherein, said dynamic state parameter identification step S51 comprises, step S511 for identifying the order and parameter of an ARMAX model using identification method in the adaptive control according to sampled sequence Y, or step S512 for identifying parameter using reference model method according to sampled sequence Y, or step S513 for identifying parameter using Kalman filter according to sampled sequence Y.

Wherein said static state parameter identification step S52 comprises: step S521 for calculating stable state value for the sampled sequence Y at first, step S522 for, secondly, according to the stable state value, identifying the static state parameter using a parameter estimation method, a correlation coefficient method, a linear regression method, a linearizable linear regression method, or the least square method; and said step S521 for calculating stable state value comprises:

S5211: judging, according to the sampled sequence Y, whether the current sample value is in a stable state process or in a transient state process;

S5212: when it is determined that the current sample value is in the stable state process, calculating the average value as the stable state value according to the sampled sequence Y;

S51213: when it is determined that the current sample value is in the transient state process, calculating the force component as the stable state value according to the sampled sequence Y.

In said step S5211, according to the "t" distribution or the simplification thereof, or the output result of a filter, it is judged whether the current sample value is in the stable state process or the transient state process; and said filter is a Kalman filter or $\alpha\beta\gamma$ filter. For example, the sampled sequence Y is filtered by the Kalman filter or the $\alpha\beta\gamma$ filter to obtain each component of the state variable; then it is judged whether each component of the state variable goes beyond a corresponding preset value; if one or more components go beyond the preset value, the current sample value is determined to be in the transient state process, otherwise, if none of them goes beyond, the current sample value is determined to be in the stable state process. Said Kalman filter is, at least, provided with 1 order, or more orders, such as 2-order, 3-order, etc., and the present invention would not make restriction for this.

Wherein the force component is calculated according to the following steps in said step S5213:

S52131: calculating the n+1 th derivative of v, with n=0, 1, . . . , according to the sampled sequence Y until $$\left|\frac{d^{n+1} y}{d t^{n+1}}\right| \leq \varepsilon$$

is satisfied, thereby determining n, where $\epsilon$ is an constant approximate to 0;

S52132: performing variable substitution of $$x = \frac{d^n y}{d t^n}$$

and calculating data sequence $\{x_k\}$ based on the sampled sequence Y;

S52133: judging, for the data sequence $\{x_k\}$, whether the current value $x_k$ is in the transient state process or in the stable state process;

S52134: if it is determined that the current value $x_k$ is in the stable state process, calculating the average value $\bar{x}_k$ as the stable state value $\hat{x}_k$ according to $\{x_k\}$ and proceeding to step S52135; and if it is determined that the current value $x_k$ is in the transient state process, making k=1;

S52135: performing integral inverse transformation on the stable state value $\hat{x}_k$ of x to calculate the force component $\hat{y}_k$ of y.

In said step S52135, the force component $\hat{y}_k$ is calculated according to $\hat{y}_k = a_0 + a_1 \cdot t + a_2 \cdot t^2 + a_3 \cdot t^3 + \ldots + a_n \cdot t^n$, wherein $$a_n = \frac{1}{n!} \cdot \hat{x}_k$$

and $a_0, a_1, a_2, \ldots, a_{n-1}$ is the constant determined based on the derivative equation, the physical quantity y and the initial value of all-order derivatives thereof.

In said step S52133, according to the "t" distribution or the simplification thereof, or the output result of the filter, the current sample value $x_k$ is judged whether it is in the stable state process or the transient state process; and said filter is a Kalman filter or $\alpha\beta\gamma$ filter. For example, the sampled sequence $\{x_k\}$ is filtered by the Kalman filter or the $\alpha\beta\gamma$ filter to obtain each component of the state variable; then it is judged whether each component of the state variable goes beyond a corresponding preset value; if one or more components go beyond the preset value, the current value $x_k$ is determined to be in the transient state process, otherwise, if none of them goes beyond, the current value $x_k$ is determined to be in the stable state process. Said Kalman filter is, at least, provided with 1 order, or more orders, such as 2-order, 3-order, etc., and the present invention would not make restriction for this.

A parameter identification system comprising said data sampling system further comprises a parameter identification unit used for identifying dynamic state parameter and/or identifying static state parameter according to the sampled sequence Y.

When it is required to identify the dynamic state parameter, said parameter identification unit can be a dynamic state parameter identification unit, which is used for, according to the sampled sequence Y, identifying the order and parameter of the ARMAX model using the identification method in the adaptive control, or identifying parameter using reference model method, or identifying parameter using Kalman filter.

When it is required to identify the static state parameter, said parameter identification unit can be a static state parameter identification unit, which comprises: a stable state value calculating unit, used for calculating stable state value according to the sampled sequence Y; and a static state parameter estimating unit, used for, according to the stable state value, estimating the static state parameter using the parameter estimation method, the correlation coefficient method, the linear regression method, the linearizable linear regression method, or the least square method.

Said stable state value calculating unit comprises:

a judging unit, used for, according to the sampled sequence Y, judging whether the current sample value is in the stable state process or the transient state process based on the "t" distribution or the simplification thereof, or the output result of the filter, where said filter is a Kalman filter or $\alpha\beta\gamma$ filter;

a stable-state-calculating unit A, used for, when it is determined that the current sample value is in the stable state process, calculating the average value as the stable state value according to the sampled sequence Y; and a stable-state-calculating unit B, used for, when it is determined that the current sample value is in the transient state process, calculating the force component as the stable state value according to the sampled sequence Y.

Wherein, the stable-state-calculating unit B comprises:

a derivation unit, used for calculating the n+1th derivative of y, with n=0, 1, . . . , according to the sampled sequence Y until $$\left|\frac{d^{n+1}y}{dt^{n+1}}\right| \leq \varepsilon$$

is satisfied, thereby determining n, where $\varepsilon$ is an constant approximate to 0;

a substitution unit, used for performing variable substitution of $$x = \frac{d^n y}{dt^n}$$

and calculating data sequence $\{x_k\}$ based on the sampled sequence Y;

a judging unit, used for receiving the data sequence $\{x_k\}$ and judging whether the current value $x_k$ is in the transient state process or in the stable state process;

an averaging unit, used for, if it is determined that the current value $x_k$ is in the stable state process, calculating the average value $\bar{x}_k$ as the stable state value $\hat{x}_k$ according to $\{x_k\}$ and proceeding to a recovering unit; and if it is determined that the current value $x_k$ is in the transient state process, making k=1 and proceeding to the exit;

the recovering unit, used for calculating the force component $\hat{y}_k$ according to $\hat{y}_k = a_0 + a_1 \cdot t + a_2 \cdot t^2 + a_3 \cdot t^3 + \ldots + a_n \cdot t^n$, wherein $$a_n = \frac{1}{n!} \cdot \hat{x}_k$$

and $a_0, a_1, a_2, \ldots, a_{n-1}$ is the constant determined based on the derivative equation, the physical quantity y and the initial value of all-order derivatives thereof.

By enabling the sample frequency satisfy the upper limit of the sample frequency, or by decreasing frequency using re-sampling to satisfy the upper limit of the sample frequency, the data sampling method of the present invention reduces a bigger error in the time domain and S-domain caused by the cut-off error of the digital sampling and the digital system, makes the S-domain error be within the scope of the acceptable error $\zeta_{max}$, and keeps the digital control be stable, thereby satisfying the practical application requirement.

By applying the above said data sampling method and system, the parameter identification method and system can identify the dynamic state parameter and the static state parameter accurately, in particular, identify the static state parameter after the stable state value is calculated, so that the static state parameter obtained finally can be more accurate.

BRIEF DESCRIPTION OF THE DRAWINGS

FIG. 4 is the diagram of the second data sampling method according to the embodiment of the present invention.

DETAILED DESCRIPTION OF THE EMBODIMENTS

Figure 1:
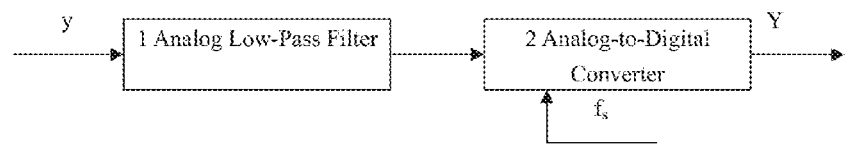
FIG. 1 is the diagram of the first data sampling method according to the embodiment of the present invention.

Embodiments of the present invention would be described in detail in the following, and examples of said embodiments are illustrated in the drawings, wherein the same or similar reference refers to the same or similar element or the element with the same or similar function throughout. The following embodiments described by referring to the drawings are only demonstrative, and they are for the purpose of illustrating the present invention, but they should not be interpreted as the limitation to the present invention.

FIG. 1 is the diagram of the first data sampling method, where an electric signal y of a physical quantity is firstly filtered by passing through an analog low-pass filter 1, and then sampled by the analog-to-digital converter 2 to output a sampled sequence Y. The sampling process is controlled by a control signal, and the frequency $f_s$ of the sampling control signal, besides satisfying $f_s > f_{sl}$, also satisfies:

$$f_s \leq f_{sh} = \zeta_{max}/\epsilon$$

where $\epsilon$ is a Z-domain error of the sampling system, and $\zeta_{max}$ is the maximum error of an S-domain.

The mathematical description of the dynamic state process, in which an analog quantity varies with time, is a time domain differential equation; the time domain differential equation can be exerted a Laplacian conversion to be a transfer function G(s). It is proved by cybernetics that G(s) is rigorously corresponding to the time domain differential equation with no distortion, thus the time domain error σ is rigorously corresponding to the S-domain error ζ, and if there is an acceptable maximum error $\sigma_{max}$ in time domain, correspondingly, there is an acceptable maximum error $\zeta_{max}$ in S-domain.

By performing signal sampling on an analog quantity of time domain, the analog quantity is converted from analog to digital and sampled in order to obtain the sampling data. According to Digital Automatic Control theory, it is considered that, by converting the time domain to Z-domain, the differential equation in time domain would be converted to a transfer function H(z) of the Z-domain. In Z-domain, the limited digits of the digital computer would bring out the minimum grids, commonly named as resolution ratio, and half of the resolution ratio is referred to as cut-off error δ. Further the digits being expressed in the computer would also result in the cut-off error δ, upon that there is an error ϵ in the Z-domain, after the software and hardware of the applied sampling system are determined, the Z-domain error ϵ of the system can be accordingly determined.

For example, the resolution ratio of the analog-to-digital conversion is determined by the digits of the analog-to-digital converter ADC, and the cut-off error ϵ brought out is half of the resolution ratio, such as the $\delta_{adc}$ of 8-digit ADC is 0.004 and the $\delta_{adc}$ of 10-digit ADC is 0.001. Further for example, a value is expressed in form of binary digits in a computer, and the number of digits of the binary digits would also result in the cut-off error $\delta_{cpu}$, such as the $\delta_{cpu}$ of 16-digit binary digits is $2 \times 10^{-5}$, the $\delta_{cpu}$ of a single-precision floating-point number is $10^{-6}$, and the $\delta_{cpu}$ of a double-precision floating-point number is $10^{-15}$.

The Z-domain error ϵ can be analyzed from the cut-off error δ by using error analysis, and more specifically, the Z-domain error of said sampling system satisfies ϵ≥δ, where said δ is the cut-off error of the sampling system. The cut-off error δ of said sampling system is associates with $\delta_{adc}$ and $\delta_{cpu}$, simply, it can be the $\delta_{adc}$ or $\delta_{cpu}$, or the smaller one of the $\delta_{adc}$ and $\delta_{cpu}$.

Furthermore, the Z-domain error of said sampling system $\epsilon = k_\alpha \cdot \delta$, where said $k_\alpha$ is a safety factor larger than 1 and is determined by the random interference level in the course of sampling, as well as the computation error of the value in the sampling system or the combination thereof.

The inventor discovers, through painstaking research, that there is association between the Z-domain error ϵ and the S-domain error ζ of the system, concretely is:

The conversion from S-domain to Z-domain satisfies $z = e^{s \cdot T_s}$, where $T_s$ is a sampling period, in reverse, the conversion from Z-domain to S-domain satisfies $$s = \frac{1}{T_s} \cdot \ln(z).$$

Assuming s=x+jy and $z = r \cdot e^{j\theta}$, then:

$$r = e^{x \cdot T_s}, \theta = y \cdot T_s \quad (1)$$

$$x = f_s \cdot \ln(r), y = f_s \cdot \theta \quad (2)$$

$$\therefore dx = f_x \cdot \frac{dr}{r}, dy = f_s \cdot d\theta$$

Due to that the left half plane of the Z-domain closing to the imaginary axis can be mapped to a circular ring of the Z-domain with the radius being approaching to 1, that is to say r≈1, $$\therefore dx \approx f_s \cdot dr \quad (3)$$

$$dy = f_s \cdot d\theta \quad (4)$$

then the error $\zeta_x$ in x-direction and the error in y-direction of the S-domain respectively are:

$$\zeta_x \approx f_s \cdot \epsilon \quad (5)$$

$$\zeta_y = f_s \cdot \epsilon \quad (6)$$

the S-domain error ζ can be obtained from the equations (5) and (6):

$$\zeta \approx f_s \cdot \epsilon \quad (7)$$

that is to say, the S-domain error is $f_s$ times of the Z-domain error, where $f_s$ is the sampling frequency, $$f_s = \frac{1}{T},$$

and $T_s$ is the sampling interval.

Therefore, in order to ensure the S-domain error be within an acceptable range $\zeta_{max}$, the sampling frequency $f_s$ should satisfy:

$$f_s \leq f_{sh} = \zeta_{max}/\epsilon \quad (8)$$

that is to say, the sampling frequency upper limit satisfies $f_{sh} = \zeta_{max}/\epsilon$.

Figure 2:
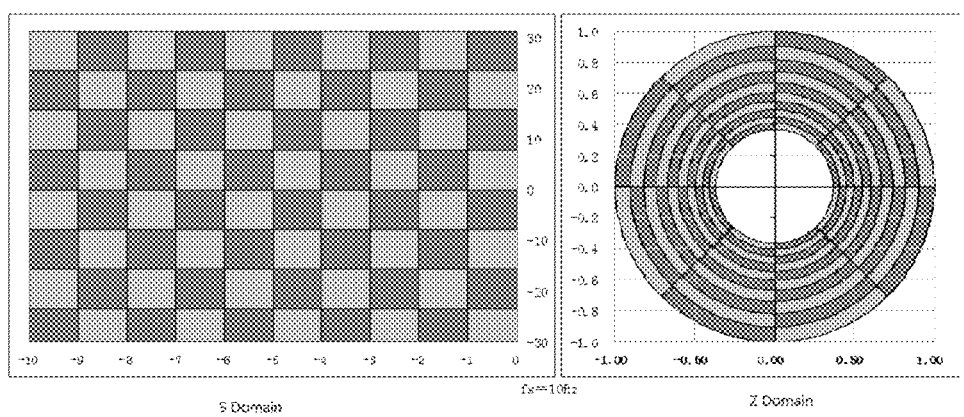
FIG. 2 is the diagram showing the impact on the grids of S-domain and Z-domain caused by the sampling frequency when $f_s$=10 Hz.

Referring to FIG. 2, it illustrates a diagram of the impact on the grids of S-domain and Z-domain caused by the sampling frequency when $f_s$=10 Hz. When $f_s$=10 Hz, (−10~0, −31.4~31.4) in the S-domain is mapped to a circular ring of the Z-domain with the radius being (0.37~1).

Figure 3:
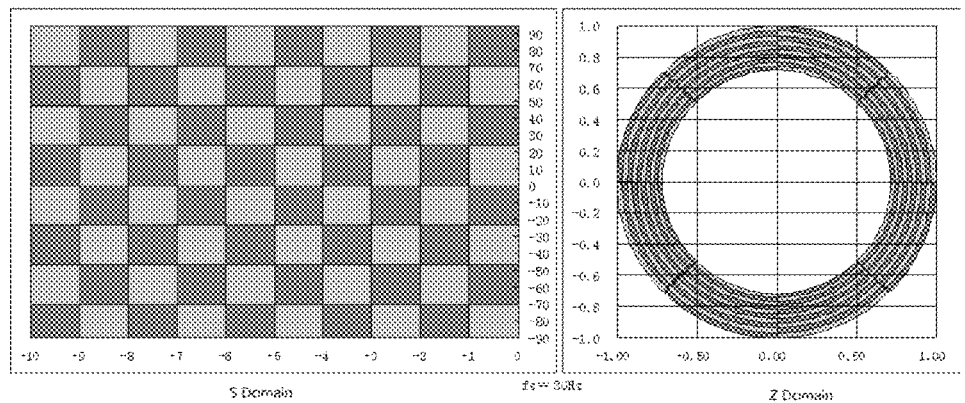
FIG. 3 is the diagram showing the impact on the grids of S-domain and Z-domain caused by the sampling frequency when $f_s$=30 Hz.

Referring to FIG. 3, it illustrates a diagram of the impact on the grids of S-domain and Z-domain caused by the sampling frequency when $f_s$=30 Hz. When $f_s$=30 Hz, (−10~0, −94.2~94.2) in the S-domain is mapped to a circular ring of the Z-domain with the radius being (0.72~1).

Compared with the FIG. 2 and FIG. 3, it can be seen that $f_s$ is fastened for 3 times from 10 Hz up to 30 Hz, accordingly, the S-domain is enlarged for 6.67 times, instead the Z-domain is reduced for 1.92 times. In other words, along with the increasing sampling frequency $f_s$, a little area in Z-domain would represent an area lager and larger in S-domain. The Z-domain grid in FIG. 3 is smaller than the S-domain grid in evidence, and the S-domain grid in FIG. 3 is larger than the Z-domain grid in evidence. It can be concluded that along with the fastening sampling frequency $f_s$, the Z-domain grid would become smaller and smaller, instead the corresponding S-domain grid would become larger and larger. After the software and hardware of the sampling system are determined, the Z-domain error s and gird are determined accordingly, then the S-domain grid would be larger and larger along with the fastening sampling frequency $f_s$. Half of the grid is the quantization error, so the S-domain error will be increased.

Thus, the inventor proposes that there is an upper limit for the sampling frequency, that is $f_{sh} = \zeta_{max}/\epsilon$, different from the conventional ideas that it is considered the faster the sampling frequency the better. Similarly, the relation between time domain error σ and Z-domain error ε as well as the sampling frequency $f_s$ can be concluded by using the same error analysis method as the above. Because the frequency domain, namely the S-domain, is applied in practical application in most case, the present invention would not describe this in detail, but it is also should be fallen into the scope of the present invention.

In practical application, in order to reduce the volume and lower the cost, normally the sampling frequency is relatively high and does not satisfy the requirement of the sampling frequency upper limit $f_{sh}$, thus if not dealing with it, the error in S-domain and time domain would be very big and the application requirement can not be satisfied, accordingly the present invention further proposes a second data sampling method and system, enabling the sampled data satisfy the sampling frequency upper limit, thereby improving the accuracy of the sampling data.

As shown in FIG. 4, provided is an embodiment of the second data sampling method, and the method comprises the following steps:

S1: sampling the electric signal y of the physical quantity with a sampling frequency satisfying the Nyquist theorem to obtain a sampled sequence Y1;

S2: performing low-pass filtering on the sampled sequence Y1 to obtain a filtered sampled sequence Y2;

S3. re-sampling the filtered sampled sequence Y2 to obtain a sampled sequence Y; said re-sampling frequency being $f_{rs}$ and said $f_{rs} \leq f_{sh} = \zeta_{max}/\epsilon$; where ε is the Z-domain error of the sampling system and $\zeta_{max}$ is the maximum error of the S-domain;

S4: outputting the sampled sequence Y.

Further, the cut-off frequency of said low-pass filter is $f_c$ and said $f_c \leq 0.5 \times f_{rs}$, avoiding the occurrence of mixing in the course of re-sampling.

Wherein the Z-domain error of said sampling system satisfies $\epsilon \geq \delta$, and said δ is the cut-off error of the sampling system. The cut-off error δ of said sampling system is associates with $\delta_{adc}$ and $\delta_{cpu}$, simply, it can be $\delta_{adc}$ or $\delta_{cpu}$, or the smaller one of the $\delta_{adc}$ and $\delta_{cpu}$.

Furthermore, the Z-domain error of said sampling system $\epsilon = k_\alpha \cdot \delta$, where said $k_\alpha$ is a safety factor larger than 1 and is determined by the random interference level in the course of sampling, as well as the computation error of the value in the sampling system or the combination thereof.

Figure 5:
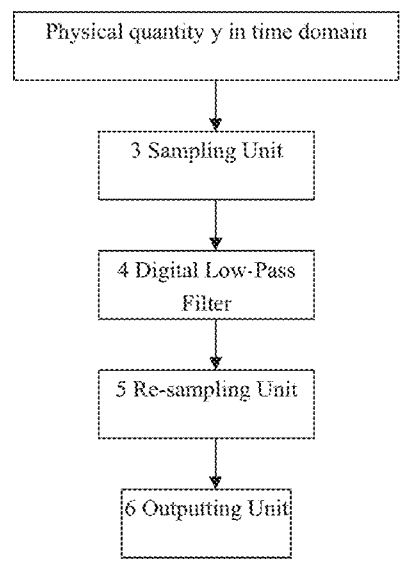
FIG. 5 is the structural diagram of a data sampling system according to the embodiment of the present invention.

As shown in FIG. 5, provided is an embodiment of the second data sampling method, and the system comprises:

a sampling unit 3, used for sampling the electric signal y of the physical quantity with a sampling frequency satisfying the Nyquist theorem to obtain a sampled sequence Y1;

a low-pass filter 4, used for implementing low-pass filtering on the sampled sequence Y1 to obtain a filtered sampled sequence Y2;

a re-sampling unit 5, used for re-sampling the filtered sampled sequence Y2 to obtain a sampled sequence Y to be outputted to an outputting unit 6; said re-sampling frequency being $f_{rs}$ and said $f_{rs} \leq f_{sh} = \zeta_{max}/\epsilon$, wherein ε is the Z-domain error of the sampling system and $\zeta_{max}$ is the maximum error of S-domain;

an outputting unit 6, used for outputting the sampled sequence Y.

Further, the cut-off frequency of said low-pass filter 4 is $f_c$ with said $f_c \leq 0.5 \times f_{rs}$, avoiding the occurrence of mixing in the course of re-sampling.

Wherein the Z-domain error of said sampling system satisfies $\epsilon \geq \delta$, and said δ is the cut-off error of the sampling system. The cut-off error δ of said sampling system is associates with $\delta_{adc}$ and $\delta_{cpu}$, simply, it can be $\delta_{adc}$ or $\delta_{cpu}$, or the smaller one of the $\delta_{adc}$ and $\delta_{cpu}$.

Furthermore, the Z-domain error of said sampling system $\epsilon = k_\alpha \cdot \delta$, where said $k_\alpha$ is a safety factor larger than 1 and is determined by the random interference level in the course of sampling, as well as the computation error of the value in the sampling system or the combination thereof.

After the re-sampling, it can be satisfied that the re-sampling frequency $f_{rs}$ is smaller than the sampling frequency upper limit $f_{sh}$, thus the S-domain error can be decreased within a preset range $\zeta_{max}$.

Figure 6:
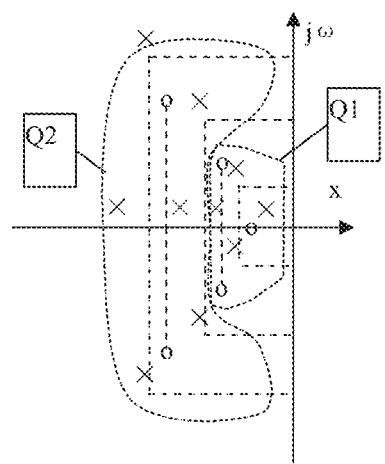
FIG. 6 is the diagram showing the zeros and poles in S-domain of one assumed application system.

In addition, the contradiction that $f_{sh} < f_{sl}$ may occur in the actual situations, causing the sampling frequency can not be selected according to $f_{sl} < f_s \leq f_{sh}$ provided in the first method. The contradiction may be solved by the above said second data sampling method, that is, to apply the method for low-pass filtering and re-sampling. The primary ploe $P_{rm}$, and the primary zero Pom play a leading role among all of the ploes $\{p_{ri}\}$ and the zeros $\{p_{oi}\}$, and the higher the frequency of the pole or the zero, the smaller it functions, thus, if the contradiction of $f_{sh} < f_{sl}$ occurs, by filtering out the high frequency poles and zeros through said low-pass filter and further re-sampling to decrease the sampling frequency, not only said contradiction can be solved, but also the accuracy of the primary pole Prm and the primary zero Pom can be ensured, where the primary pole or the primary zero is the pole or the zero approximate to the origin. As shown in FIG. 6, "x" represents poles and "o" represents zeros, and there are primary ploes $P_{rm}$ and primary zeros in the area Q1, also there are high frequency poles and high frequency zeros in the area Q2, and the zeros and poles in Q1 are more important than the zeros and poles in Q2. Once the contradiction of $f_{sh} < f_{sl}$ occurs, the low-pass filter shown in FIG. 5 should be used to filter out the high frequency poles on the top, with larger co and on the left, or with a larger absolute value for a negative x in the Q2 of FIG. 6.

By using re-sampling to decrease the sampling frequency and making the re-sampling frequency satisfy $f_{rs} \leq f_{sh} = \zeta_{max}/\epsilon$, bigger error in S-domain or time domain caused by the cut-off error of the digital sampling and the digital system can be greatly reduced by the present invention, enabling the error in the S-domain and time domain satisfy the application requirement.

The sampling method and system said above can be applied to multiple settings, and the primary application is parameter identification. In the past, it is rarely succeed in identifying either the dynamic state parameter or the static state parameter. Currently, provided with the accurate sampling data, the error would be within a preset range, greatly benefiting the parameter identification. The parameters include static state parameter or dynamic state parameter. The static state parameter is the system function coefficients, and the dynamic state parameter is the coefficients of the system differential function. For the electrical system, the static state parameter refers to the admittance matrix of the power flow equation, that is to say the resistor, reactance and susceptance of an element such as a transformer, a wire, or a generator, etc. The dynamic state parameter refers to exciting time constant, speed regulation time constant, or rotor time constant, etc.

A parameter identification method applying said two data sampling methods further comprises step S5, which comprises step S51 for performing a dynamic state parameter identification, and/or step S52 for performing a static state parameter identification according to the sampled sequence Y.

Wherein, said dynamic state parameter identification step S51 comprises, according to sampled sequence Y, step S511 for identifying the order and parameter of an ARMAX model using identification method in the adaptive control, or step S512 for identifying parameter using reference model method, or step S513 for identifying parameter using Kalman filter.

Wherein said static state parameter identification step S52 comprises: step S521 for calculating stable state value for the sampled sequence Y at first, step S522 for, according to the stable state value, identifying the static state parameter using the parameter estimation method, the correlation coefficient method, linear regression method, the linearizable linear regression method, or least square method; and said step S521 for calculating stable state value comprises:

S5211: judging, according to the sampled sequence Y, whether the current sample value is in a stable state process or in a transient state process;

S5212: when it is determined that the current sample value is in the stable state process, calculating the average value as the stable state value according to the sampled sequence Y;

S51213: when it is determined that the current sample value is in the transient state process, calculating the force component as the stable state value according to the sampled sequence Y.

Wherein, in said step S5211, according to the "t" distribution or the simplification thereof, or the output result of the filter, the current sample value is judged whether it is in the stable state process or the transient state process; and said filter is a Kalman filter or $\alpha\beta\gamma$ filter, Wherein, in said step S5213, the force component is calculated according to the following steps:

S52131: calculating the n+1th derivative of y, with n=0, 1, ..., according to the sampled sequence Y until $$\left|\frac{d^{n+1}y}{dt^{n+1}}\right| \leq \varepsilon$$

is satisfied, thereby determining n, where $\varepsilon$ is an constant approximate to 0;

S52132: performing variable substitution of $$x = \frac{d^n y}{dt^n},$$

and calculating data sequence $\{x_k\}$ based on the sampled sequence Y;

S52133: judging, for the data sequence $\{x_k\}$, whether the current value $x_k$ is in the transient state process or in the stable state process;

S52134: if it is determined that the current value $x_k$ is in the stable state process, calculating the average value $\bar{x}_k$ as the stable state value $\hat{x}_k$ according to $\{x_k\}$ and proceeding to step S52135; and if it is determined that the current value $x_k$ is in the transient state process, making k=1;

S52135: performing integral inverse transformation to the stable state value $\hat{x}_k$ of x to calculate the force component $\hat{y}_k$ of y.

In said step S52135, the force component $\hat{y}_k$ is calculated according to $\hat{y}_k = a_0 + a_1 \cdot t + a_2 \cdot t^2 + a_3 \cdot t^3 + \ldots + a_n \cdot t^n$, wherein $$a_n = \frac{1}{n!} \cdot \hat{x}_k$$

and $a_0, a_1, a_2, \ldots, a_{n-1}$ is the constant determined based on the derivative equation, the physical quantity y and the initial value of all-order derivatives thereof.

Figure 7:
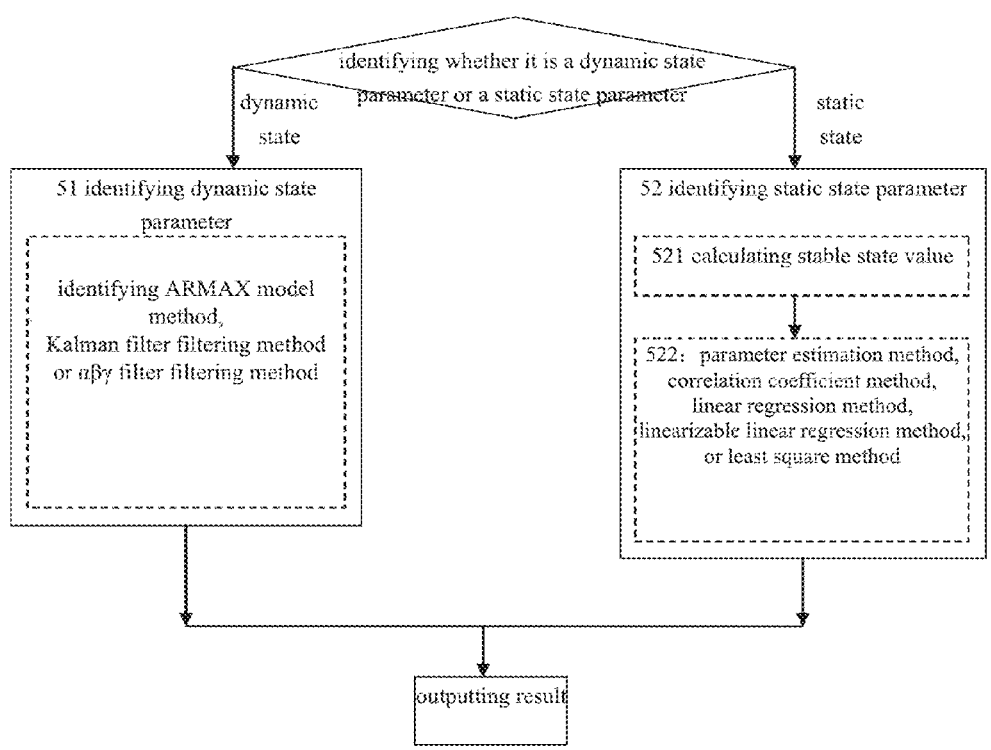
FIG. 7 is the diagram of a parameter identification system according to the embodiment of the present invention.

A parameter identification system comprising the above said data sampling system further comprises a parameter identification unit, which can be broken up into a dynamic state parameter identification unit 51 and a static state parameter identification unit 52, as shown in FIG. 7.

In FIG. 7, said dynamic state parameter identification unit 51 is used for, according to the sampled sequence Y, identifying the order and parameter of the ARMAX model using the identification method in the adaptive control, or estimating parameter using the reference model method, or estimating parameter using Kalman filter.

Figure 8:
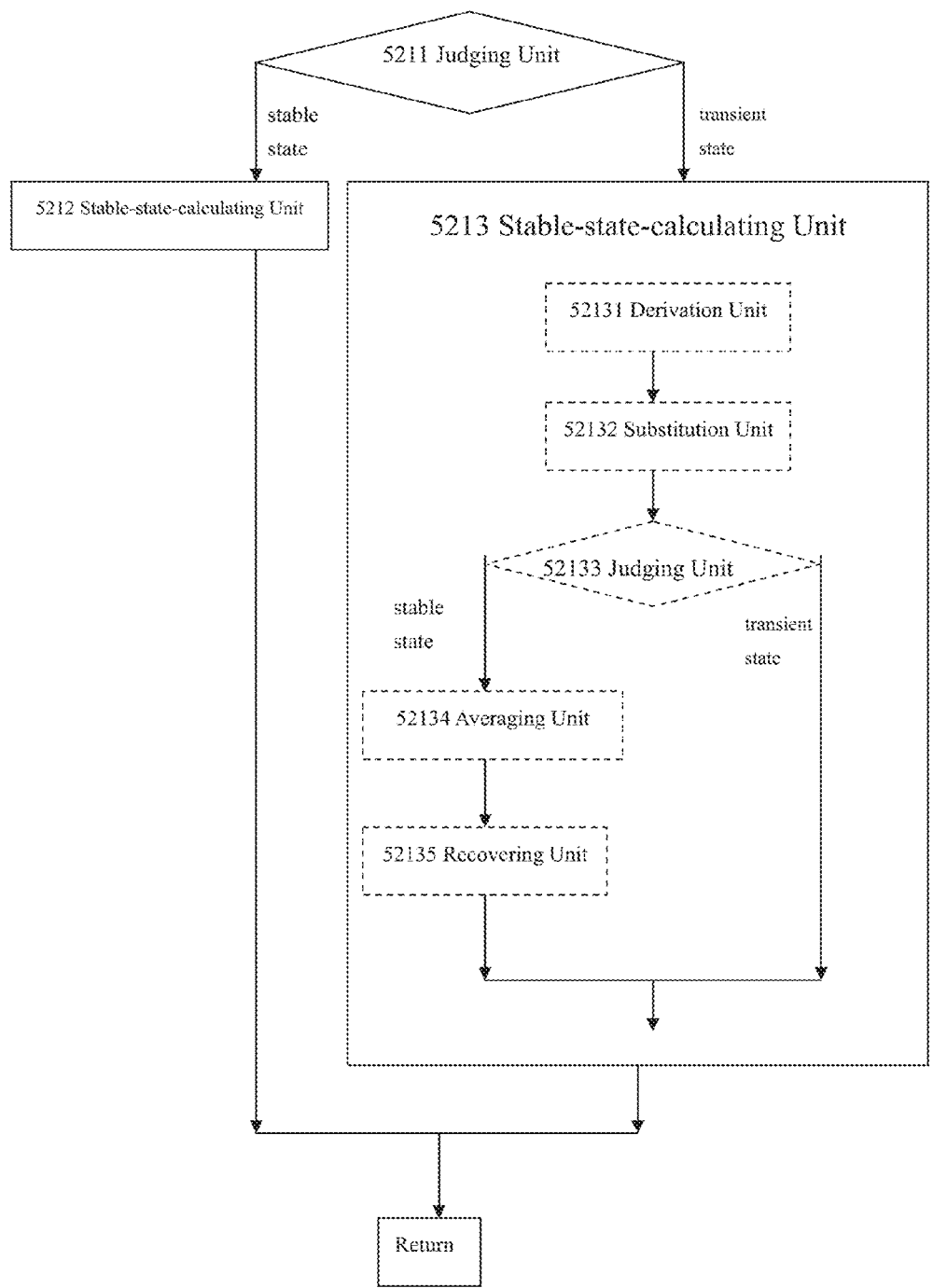
FIG. 8 is a diagram of a stable state value calculating unit.

In FIG. 7, said static state parameter identification unit 52 comprises: a stable state value calculating unit 521, used for calculating stable state value according to the sampled sequence Y; and a static state parameter estimating unit 522, used for, according to the stable state value, estimating the static state parameter using the parameter estimation method, the correlation coefficient method, linear regression method, the linearizable linear regression method, or the least square method;

FIG. 8 is the diagram of a stable state value calculating unit, and said stable state value calculating unit 521 comprises:

a judging unit 5211, used for, according to the sampled sequence Y, judging whether the current sample value is in the stable state process or the transient state process based on the "t" distribution or the simplification thereof;

a stable-state-calculating unit 5212, used for, when it is determined that the current sample value is in the stable state process, calculating the average value as the stable state value according to the sampled sequence Y; and a stable-state-calculating unit 5213, used for, when it is determined that the current sample value is in the transient state process, calculating the force component as the stable state value according to the sampled sequence Y.

Wherein, the stable-state-calculating unit 5213 comprises:

a derivation unit 52131, used for calculating the n+1th derivative of y, with n=0, 1, . . . , according to the sampled sequence Y until $$\left|\frac{d^{n+1}y}{dt^{n+1}}\right| \le \varepsilon$$

is satisfied, thereby determining n, where $\varepsilon$ is an constant approximate to 0;

a substitution unit 52132, used for performing variable substitution of $$x = \frac{d^n y}{dt^n}$$

and calculating data sequence $\{x_k\}$ based on the sampled sequence Y;

a judging unit 52133, used for receiving the data sequence $\{x_k\}$, and judging whether the current value $x_k$ is in the transient state process or in the stable state process based on the "t" distribution or the simplification thereof;

an averaging unit 52134, used for, if it is determined that the current value $x_k$ is in the stable state process, calculating the average value $\bar{x}_k$ as the stable state value $\hat{x}_k$ according to $\{x_k\}$ and proceeding to a recovering unit 52135; and if it is determined that the current value $x_k$ is in the transient state process, making k=1 and proceeding to the exit;

the recovering unit 52135, used for calculating the force component $\hat{y}_k$ according to $\hat{y}_k = a_0 + a_1 \cdot t + a_2 \cdot t^2 + a_3 \cdot t^3 + \ldots + a_n \cdot t^n$, wherein $$x = \frac{d^n y}{dt^n}$$

and $a_0, a_1, a_2, \ldots, a_{n-1}$ is the constant determined based on the derivative equation, the physical quantity y and the initial value of all-order derivatives thereof.

In the judging unit 52133, said "t" distribution criterion is:

$$F = \begin{cases} 1, & \text{if } \frac{|x_k - \bar{x}_k|}{\hat{s}_k} \text{ complies with } t(k) \text{ distribution} \\ 0, & \text{if } \frac{|x_k - \bar{x}_k|}{\hat{s}_k} \text{ does not comply with } t(k) \text{ distribution} \end{cases}$$

and if F=1, $x_k$ is in the stable state process; and if F=0, $x_k$ is in the transient state process, where $\bar{x}_k$ is the average value, $\hat{s}_k$ is the standard deviation and t(k) is the "t" distribution with the free degree is 1.

Said criterion can be simplified as:

$$F = \begin{cases} 1, & \text{if } |x_k - \bar{x}_k| \le G \cdot \hat{s}_k \\ 0, & \text{if } |x_k - \bar{x}_k| > G \cdot \hat{s}_k \end{cases}$$

wherein, $\bar{x}_k$ is the average value, $\hat{s}_k$ is the standard deviation and G is a given constant. Said G is provided with a value among 2.5~15.

Said criterion can be further simplified as:

$$F = \begin{cases} 1, & \text{if } |x_k - \bar{x}_k| \le \delta \cdot x_e \\ 0, & \text{if } |x_k - \bar{x}_k| > \delta \cdot x_s \end{cases}$$

wherein, $\hat{x}_k$ is the average value, $\delta$ is a given constant and $x_e$ is the rated value of the physical quantity x. Said $\delta$ is provided with a value among 0.1%~10%.

Said average value $\bar{x}_k$ and standard deviation $\hat{s}_k$ can be calculated according to the following method:

when F=1 is changed to F=0, that is to say the current value $\bar{x}_k$ is changed into the transient state process from the stable state process, making k=1;

when $k = 1: \bar{x}_k = x_k, \hat{s}_k^2 = 0, k = k+1$;

when $k \ge 2: \bar{x}_k = \frac{1}{k} \cdot ((k-1) \cdot \bar{x}_{k-1} + x_k)$, $\hat{s}_k^2 = \frac{k-2}{k-1} \hat{s}_{k-1}^2 + (\bar{x}_k - \bar{x}_{k-1})^2 + \frac{1}{k-1}(\bar{x}_k - x_k)^2, k = k+1$.

The filtering algorithm can also be used to judge whether the current sample value $x_k$ in the stable state process or the transient state process, and concretely comprises: filtering the sampled sequence $\{x_k\}$ by the Kalman filter to obtain each component of the state variable; then judging whether each component of the state variable goes beyond a corresponding preset value; if one or more components go beyond the preset value, judging the current value $x_k$ is in the transient state process, otherwise, if none of them goes beyond, judging the current value $x_k$ is in the stable state process.

Wherein, the steps used by said judging unit 5211, for judging whether the current value is in the stable state process or the transient state process based on the "t" distribution and the simplification thereof according to the sampling sequence Y, and for calculating the average value and standard deviation, are similar to the steps used by the judging unit 52133 and need not to be repeated here.

By making the sampling frequency satisfy the sample frequency upper limit, or using re-sampling to decrease the sampling frequency, the data sampling method and system in the present invention can reduce the bigger error in S-domain or time domain caused by the cut-off error of the digital sampling and the digital system, enabling the S-domain error be within an acceptable range, thereby satisfying the requirement of practical application.

By applying the above said data sampling method and system, the parameter identification method and system of the present invention can identify the dynamic state parameter and the static state parameter accurately, in particular, identify the static state parameter after the stable state value is calculated, thereby the last obtained static state parameter would be more accurate.

Because telemetering collects the local digital measurement data through communication, in accordance with the theory and character used for obtaining data from local digital measurement, so the data sampling method and system of the present invention is also applicable to a telemetry method and system which should also be protected.

The structure, feature and functional result of the present invention are described in detail above in terms of the embodiments illustrated in drawings. The above mentioned are only the preferable embodiments of the present invention, however the implementation scope of the present invention should not be limited by the shown drawings. The changes that make according to the concept of the present invention, or the equivalent embodiments that are modified as the equivalent changes, in the condition that they do not go beyond the spirit covered by the description and the drawings, all should be regarded as falling into the protecting scope of the present invention.

What is claimed is:

1. A data sampling method for converting an analog signal to a digital signal, comprising the following steps:
   S1: sampling, by an analog-to-digital converter, and analog signal y of a physical quantity with a sampling frequency satisfying Nyquist theorem to obtain a sampled sequence Y1;
   S2: performing, by a digital low-pass filter, on the sampled sequence Y1 to obtain a filtered sampled sequence Y2;
   S3: re-sampling, by a processor, the filtered sampled sequence Y2 to obtain a sampled sequence Y at a re-sampling frequency $f_{rs}$ and said $f_{rs} \leq f_{sh} = \zeta_{max}/\epsilon$; where $\epsilon$ is a Z-domain error of a sampling system and $\zeta_{max}$ is a maximum error of S-domain,
   S4: outputting the sampled sequence Y.

2. The data sampling method according to claim 1, wherein a cut-off frequency of said digital low-pass filter is $f_c$ and said $f_c \leq 0.5 \times f_{rs}$.

3. The data sampling method according to claim 1, wherein the Z-domain error of said sampling system $\epsilon \geq \delta$, where said $\delta$ is a cut-off error of the sampling system.

4. The data sampling method according to claim 3, wherein the cut-off error $\delta$ of the sampling system is associated with $\delta_{adc}$ and $\delta_{cpu}$, where $\delta_{adc}$ is a half of resolution ratio of the analog-to-digital converter and $\delta_{cpu}$ is a cut-off error of expressing digits for value in a computer.

5. The data sampling method according to claim 3, wherein the Z-domain error of said sampling system satisfies that $\epsilon = k_\alpha \cdot \delta$, where said $k_\alpha$ is a safety factor lager than 1 and its value is determined by random disturbance level during sampling, a computation error of value in the sampling system or a combination thereof.

6. The data sampling method according to claim 1, wherein said maximum error $\zeta_{max}$ in S-domain is determined by an application system and includes $\zeta_{max}$ determined by acceptable error of S-domain zero-poles of the application system, or $\zeta_{max}$ determined correspondingly by an acceptable maximum error $\sigma_{max}$ of a time-domain differential equation of the application system.

7. A data sampling system for converting an analog signal to a digital signal, comprising:
   an analog-to-digital converter for sampling an analog signal y of a physical quantity with a sampling frequency satisfying the Nyquist theorem to obtain a sampled sequence Y1;
   a low-pass filter for implementing digital low-pass filtering on the sampled sequence Y1 to obtain a filtered sampled sequence Y2;
   a processor configured to re-sample the filtered sampled sequence Y2 to obtain a sampled sequence Y at a re-sampling frequency $f_{rs}$ and said $f_{rs} \leq f_{sh} = \zeta_{max}/\epsilon$; where $\epsilon$ is a Z-domain error of a sampling system and $\zeta_{max}$ is a maximum error of S-domain.

8. The data sampling system according to claim 7, wherein a cut-off frequency of said low-pass filter is $f_c$ with said $f_c \leq 0.5 \times f_{rs}$.

9. A parameter identification system comprising:
   a data sampling system for converting an analog signal to a digital signal, including:
      an analog-to-digital converter for sampling an analog signal v of a physical quantity with a sampling frequency satisfying the Nyquist theorem to obtain a sampled sequence Y1;
      a low-pass filter for implementing digital low-pass filtering on the sampled sequence Y1 to obtain a filtered sampled sequence Y2;
      a processor configured to re-sample the filtered sampled sequence Y2 to obtain a sampled sequence Y at a re-sampling frequency $f_{rs}$ and said $f_{rs} \leq f_{sh} = \zeta_{max}/\epsilon$, where $\epsilon$ is a Z-domain error of a sampling system and $\zeta_{max}$ is a maximum error of S-domain, wherein the processor is configured to perform dynamic state parameter identification and static state parameter identification according to the sampled sequence Y.

10. The parameter identification system according to claim 9, wherein the processor is configured to, according to the sampled sequence Y, identify an order and parameter of an ARMAX model using an identification method in an adaptive control, identify a parameter using a reference model method, or identity a parameter using a Kalman filter.

11. The parameter identification system according to claim 9, wherein the processor is configured to:
   calculate a stable state value according to the sampled sequence Y; and
   according to the stable state value, estimate a static state parameter using a parameter estimation method, a correlation coefficient method, a linear regression method, a linearizable linear regression method, or a least square method.

12. The parameter identification system according to claim 11, wherein the processor is configured to:
   according to the sampled sequence Y, judge whether a current sample value is in a stable state process or a transient state process based on a "t" distribution or a simplification thereof, or a output result of a filter, wherein said filter is a Kalman filter or αβγ filter;
   when the current sample value is in the stable state process, calculate an average value as the stable state value according to the sampled sequence Y; and
   when the current sample value is in the transient state process, calculate a force component as the stable state value according to the sampled sequence Y.

13. The parameter identification system according to claim 12, wherein the processor is configured to:
   n+1th derivative of y, with n=0, 1, . . . , according to the sampled sequence Y until $$\left| \frac{d^{n+1} y}{d t^{n+1}} \right| \leq \varepsilon$$

is satisfied, thereby determine n, where $\epsilon$ is a constant approximate to 0;
   perform variable substitution of $$x = \frac{d^n y}{d t^n},$$

and calculate data sequence $\{x_k\}$ based on the sampled sequence Y;

receive the data sequence $\{x_k\}$ and judge whether a current value $x_k$ is in the transient state process or in the stable state process;

when the current value $x_k$ is in the stable state process, calculate an average value $\bar{x}_k$ as the stable state value $\hat{x}_k$ according to $\{x_k\}$ and proceed to recovery; and when the current value $x_k$ is in the transient state process, make k=1 and proceed to exit;

at recovery, calculate a force component $\hat{y}_k$ according to equation $\hat{y}k = a_0 + a_1 \cdot t + a_2 \cdot t^2 + a_3 \cdot t^3 + \ldots + a_n \cdot t^n$, wherein $$a_n = \frac{1}{n!} \cdot \hat{x}_k$$

and $a_0, a_1, a_2, \ldots, a_{n-1}$ is a constant determined based on a derivative equation, the analog signal y and an initial value of all-order derivatives thereof.

* * * * *